United States Patent [19]
Goff et al.

[11] Patent Number: 5,808,485
[45] Date of Patent: Sep. 15, 1998

[54] CLOCK CLAMPING CIRCUIT THAT PREVENTS CLOCK GLITCHING AND METHOD THEREFOR

[75] Inventors: Lonnie C. Goff, Tempe, Ariz.; Brian Logsdon, Akron, Ohio

[73] Assignee: VLSI Technology, Inc., San Jose, Calif.

[21] Appl. No.: 693,906

[22] Filed: Aug. 5, 1996

[51] Int. Cl.[6] ................................................. H03K 5/156
[52] U.S. Cl. .............................. 327/20; 327/18; 327/23; 327/142
[58] Field of Search .................................. 327/18, 20, 23, 327/24, 34, 35, 142, 551, 331

[56] References Cited

U.S. PATENT DOCUMENTS

| | | | |
|---|---|---|---|
| 4,362,957 | 12/1982 | Stern | 307/527 |
| 4,374,361 | 2/1983 | Holden | 328/120 |
| 5,161,175 | 11/1992 | Parker et al. | 377/70 |

*Primary Examiner*—Toan Tran
*Assistant Examiner*—An T. Luu
*Attorney, Agent, or Firm*—Allen J. Moss; Jeffrey D. Moy; Harry M. Weiss & Associates, P.C.

[57] ABSTRACT

A system for clamping a clock signal line that prevents clock glitching is disclosed. The system is comprised of a plurality of logic gates which generates a signal to clamp the clock signal line only on the occurrence of the clock signal line being low, a clock clamping signal 26 is generated indicating that a peripheral device wants to clamp the clock signal line, and a start condition is detected indicating that the clock signal line may be clamped.

12 Claims, 1 Drawing Sheet

CLOCK CLAMPING CIRCUIT THAT PREVENTS CLOCK GLITCHING AND METHOD THEREFOR

BACKGROUND OF THE INVENTION

1. Field of the Invention

This invention relates to a clock clamping circuit and, more specifically, to a clock clamping circuit which prevents clock glitching.

2. Description of the Prior Art

The Inter-Integrated Circuit ($I^2C$) bus is a low speed serial bus which is designed to support any integrated circuit (IC) fabrication process (i.e., NMOS, CMOS, bipolar, etc.). The $I^2C$ bus is comprised of two signal lines, a serial data (SDA) line and a serial clock (SCL) line, which carries information between devices (i.e., microcontroller, LCD driver, memory, keyboard interface, etc.) which are coupled to the $I^2C$ bus. Each device on the $I^2C$ bus is recognized by a unique address and can operate as a transmitter or a receiver depending on the function of the device. In addition to being a transmitter or a receiver, each device can also be considered as a master or slave device when performing data transfers. A master is a device which initiates a data transfer on the $I^2C$ bus and generates the clock signals to permit the transfer. At that time, any device addressed by the master is considered to be a slave device.

The $I^2C$ bus lends itself to a microcontroller implementation and is quite difficult to implement in hardware without considerable software implementation. In general, most devices will have a peripheral controller which has a microprocessor. The microprocessor will perform bus arbitration (i.e., procedure to ensure that, if more than one master simultaneously tries to control the bus, only one is allowed to do so and the message is not corrupted); address decode; clock generation; and clock synchronization (i.e., procedure to synchronize the clock signals of two or more devices). The maximum data transfer rate can be slowed or effectively stopped for short periods of time by stretching the low period of the clock signal. Both master and slave devices can apply a clamp to the clock signal line (the master device does it in order to service unrelated $I^2C$ interrupts, the slave device does it when the slave device is too busy or too slow to accept data). There is, however, a finite amount of time between reading the current level of the clock signal line and applying the clamp. The clock signal line could be released by another device during this finite period. When the clamp is applied, the clock signal line will be forced low again causing a spike whose base and amplitude is a function of the sample/clamp rate of the microprocessor.

Therefore, a need existed to provide an improved clock clamping circuit. The clock clamping circuit must prevent clock glitching which is inherent in software driven $I^2C$ busses. The improved clock clamping circuit must also minimize the amount of silicon required to create the $I^2C$ bus interface.

SUMMARY OF THE INVENTION

In accordance with one embodiment of the present invention, it is an object of the present invention to provide an improved clock clamping circuit.

It is another object of the present invention to provide an improved clock clamping circuit that prevents clock glitching.

It is another object of the present invention to provide an improved clock clamping circuit that prevents clock glitching which is inherent in software driven $I^2C$ busses.

It is still another object of the present invention to provide an improved clock clamping circuit that minimizes the amount of silicon required to create the $I^2C$ bus interface.

BRIEF DESCRIPTION OF THE PREFERRED EMBODIMENTS

In accordance with one embodiment of the present invention, a system for clamping a clock signal line that prevents clock glitching is disclosed. The system comprises a plurality of components one of which is peripheral controller means for storing data indicating when the clock signal line can and cannot be clamped and which is further used for generating a clock clamp control signal for clamping the clock signal line. First logic gate means are coupled to the clock signal line and to the peripheral controller means for monitoring the clock clamp control signal. Second logic gate means are coupled to the clock signal line and to peripheral controller means for monitoring data stored in the peripheral controller means which indicates when the clock signal line can and cannot be clamped. Third logic gate means are coupled to an output of the first logic gate means and to an output of the second logic gate means for generating a signal to clamp the clock signal line when the clock clamp control signal indicates that the clock signal line needs to be clamped and the data stored in the peripheral controller means indicates that the clock signal line can be clamped.

In accordance with another embodiment of the present invention, a method for providing a system for clamping a clock signal line that prevents clock glitching is disclosed. The method comprises the steps of: providing peripheral controller means for storing data indicating when the clock signal line can and cannot be clamped and for generating a clock clamp control signal for clamping the clock signal line; providing first logic gate means coupled to the clock signal line and to the peripheral controller means for monitoring the clock clamp control signal; providing second logic gate means coupled to the clock signal line and to the peripheral controller means for monitoring data stored in the peripheral controller means indicating when the clock signal line can and cannot be clamped; and providing third logic gate means coupled to an output of the first logic gate means and to an output of the second logic gate means for generating a signal to clamp the clock signal line when the clock clamp control signal indicates that the clock signal line needs to be clamped and the data stored in the peripheral controller means indicates that the clock signal line can be clamped.

The foregoing and other objects, features, and advantages of the invention will be apparent from the following, more particular, description of the preferred embodiments of the invention, as illustrated in the accompanying drawings.

DETAILED DESCRIPTION OF THE PREFERRED ENBODINENT

Figure 2:
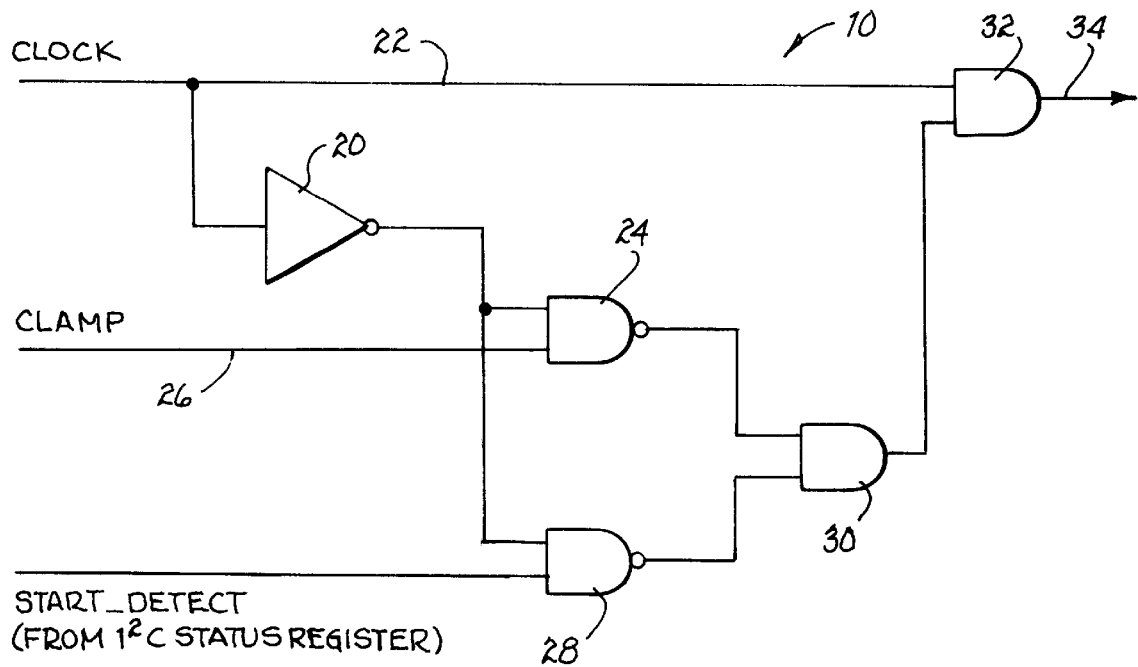
FIG. 2 a simplified functional block diagram of the circuitry used in the clock clamping circuit of the present invention.

Referring to FIG. 2, a system for clamping a clock signal line that prevents clock glitching 10 (hereinafter system 10) is shown. In the preferred embodiment of the present invention, the system 10 is used for preventing clock glitching in software driven I²C busses. However, the system 10 may be used with other types of bus interfaces such as a System Management Bus interface.

Figure 1:
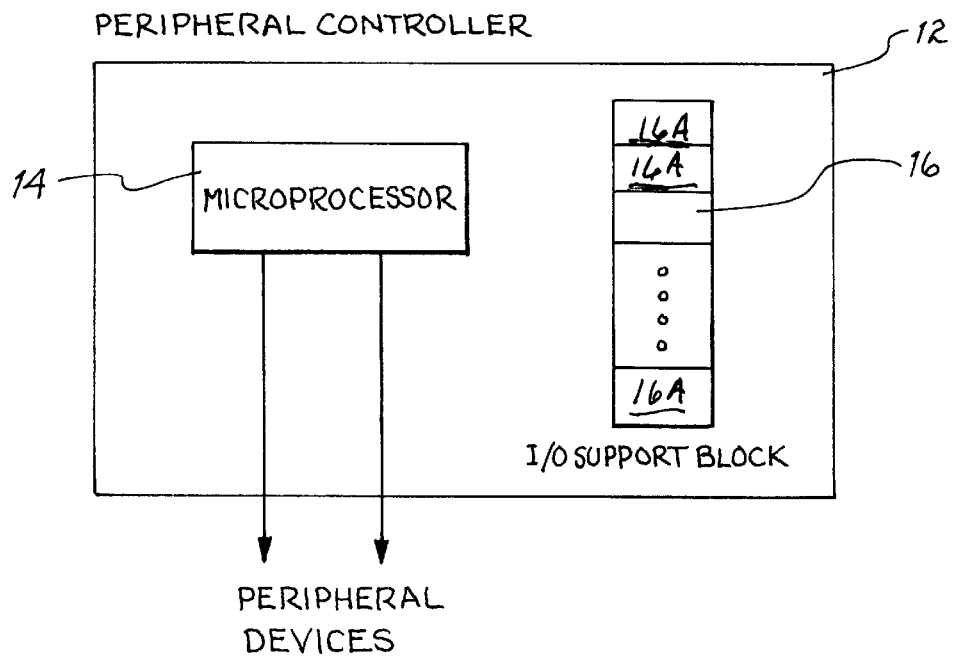
FIG. 1 is a simplified functional block diagram of a peripheral controller used in the present invention.

The system 10 uses a plurality of signals from a peripheral controller. Referring to FIG. 1, a peripheral controller 12 used in the present invention is shown. The peripheral controller 12 is used for controlling the operation of peripheral devices which are coupled to bus interfaces such as an I²C bus interface or a System Management Bus interface. The peripheral controller 12 is comprised of a plurality of elements one of which is a microprocessor 14. The microprocessor 14 is used for performing bus arbitration (i.e., procedure to ensure that, if more than one peripheral device simultaneously tries to control the bus, only one is allowed to do so and the message is not corrupted); address decode; clock generation; and clock synchronization (i.e., procedure to synchronize the clock signals of two or more peripheral devices). The microprocessor 12 will also generate a signal to clamp the clock signal line when the peripheral device coupled to the peripheral controller 12 signals the peripheral controller 12 to do so.

The peripheral controller 12 is further comprised of an Input/Output (I/O) support block 16. The I/O support block 16 is comprised of a plurality of registers 16A. Each of the registers 16A is comprised of a plurality of bits which stores information which is used by the peripheral controller 12.

One of the registers 16A is a bus status register. Within the plurality of bits of the bus status register is a start condition detect bit. The start condition detect bit is set when any Start Condition is detected. It should be noted that in order for a Start Detect condition to be generated, the clock signal line needs to go low. If unmasked, an external interrupt is generated by the microprocessor 14 at this time. This status condition causes the clock signal line to be clamped low in order to give the microprocessor 14 time to respond to the bus. The clock signal line gets unclamped when the microprocessor 14 resets the start condition detect bit. The bus status register is also comprised of a stop condition detect bit. This bit is set when any Stop Condition is detected. No clock clamping is performed when this bit is set.

Referring back to FIG. 2, the system 10 is comprised of a plurality of logic gates. One of the logic gates is an inverter 20. The inverter 20 is coupled to the clock signal line 22. The inverter 20 is used for producing an inverted clock signal.

The output of the inverter 20 is coupled to an input of a NAND gates 24. The NAND gate 24 has a second input which is coupled to a clock clamping signal 26 produced by the peripheral controller 12. The output of the inverter 20 is also coupled to an input of a second NAND gate 28. The second NAND gate 28 has a second input which is coupled to the start condition detect bit of the bus status register. The outputs of the first NAND gate 24 and the second NAND gate 28 are coupled to inputs of an AND gate 30. The inputs from the NAND gates 24 and 28 signals the AND gate 30 when to produce a signal to safely clamp the clock signal line 22 without producing any spikes. The output signal from the AND gate 30 is coupled to an input of an AND gate 32. A second input of the AND gate 32 is coupled to the clock signal line 22. The AND gate 32 produces a safely clamped clock signal 34 which will not allow clock glitching.

OPERATION

The clock signal line 22 needs to go low in order for a Start Detect condition to be generated. When the clock signal line 22 goes low, the inverter 20 will produce a high signal and will send this high signal to both NAND gates 24 and 28. The output of the first NAND gate 24 will also be high unless the peripheral controller 12 generates a signal to clamp the clock signal line 22. only if both the clock clamping signal 26 and the output of the inverter 20 are high will the first NAND gate 24 generate a low output signal.

As stated above, the output of the inverter 20 is also coupled to an input of the second NAND gate 28. When the inverter 20 outputs a high signal, the output of the second NAND gate 28 will be high unless the start condition detect bit of the bus status register generates a high signal indicating a Start Condition. Only if both the start condition detect bit and the output of the inverter 20 are high will the second NAND gate 24 generate a low output signal.

The outputs of both NAND gates 24 and 28 are coupled to inputs of the AND gate 30. The AND gate 30 will generate a signal to clamp the clock signal line 22 only if the outputs of the first NAND gate 24 and the second NAND gate 28 are low. Thus, the clock signal line 22 will only get clamped if the clock signal line 22 is low, the clock clamping signal 26 is high indicating that the peripheral device wants to clamp the clock signal line 22, and the start condition detect bit is set high indicating that a Start Condition is detected and the clock signal line 22 may be clamped. The system 10 thus prevents clock glitching since, if the clock signal line 22 is driven high during the finite amount of time between sampling the clock signal line 22 and clamping the clock signal line 22, the system 10 will not generate a signal to clamp the clock signal line 22 until the clock signal line 22 is at a low state.

While the invention has been particularly shown and described with reference to a preferred embodiment thereof, it should be understood by those skilled in the art that changes in form and detail may be made therein without departing from the spirit and scope of the invention.

What is claimed is:

1. A system for clamping a clock signal line that prevents clock glitching comprising, in combination:

peripheral controller means for storing data indicating when said clock signal line can and cannot be clamped and for generating a clock clamp control signal for clamping said clock signal line;

first logic gate means coupled to said clock signal line and to said peripheral controller means for monitoring said clock clamp control signal;

second logic gate means coupled to said clock signal line and to said peripheral controller means for monitoring data stored in said peripheral controller means indicating when said clock signal line can and cannot be clamped; and third logic gate means coupled to an output of said first logic gate means and to an output of said second logic gate means for generating a signal to clamp said clock signal line when said clock clamp control signal indicates that said clock signal line needs to be clamped and said data stored in said peripheral controller means indicates said clock signal line can be clamped; and wherein said first logic gate means is a NAND gate.

2. The system of claim 1 wherein said peripheral controller means comprises:

microprocessor means for generating said clock clamp control signal for clamping said clock signal line; and register means coupled to said microprocessor means and having a plurality of bits wherein at least one bit of said plurality of bits indicates a start condition when said clock signal line may begin to be clamped and a second bit of said plurality of bits indicates a stop condition when said clock signal line cannot be clamped.

3. The system of claim 1 further comprising inverter means having an input coupled to said clock signal line and an output coupled to an input of said first logic gate means and to an input of said second logic gate means for sending an inverted clock signal to said first logic gate means and to said second logic gate means.

4. The system of claim 1 wherein said second logic gate means is a NAND gate.

5. The system of claim 1 wherein said third logic gate means is an AND gate.

6. A system for clamping a clock signal line that prevents clock glitching comprising, in combination:

peripheral controller means for storing data indicating when said clock signal line can and cannot be clamped and for generating a clock clamp control signal for clamping said clock signal line, said peripheral controller means comprising:
microprocessor means for generating a clock clamp control signal for clamping said clock signal line; and
register means coupled to said microprocessor means and having a plurality of bits wherein at least one bit of said plurality of bits indicates a start condition when said clock signal line may begin to be clamped and a second bit of said plurality of bits indicates a stop condition when said clock signal line cannot be clamped;

inverter means having an input coupled to said clock signal line for providing an inverted clock signal;

first logic gate means having an input coupled to an output of said inverter means and another input coupled to said peripheral controller means for monitoring said clock clamp control signal;

second logic gate means having an input coupled to said output of said inverter means and another input coupled to said peripheral controller means for monitoring data stored in said peripheral controller means indicating when said clock signal line can and cannot be clamped; and third logic gate means having an input coupled to an output of said first logic gate means and another input coupled to an output of said second logic gate means for generating a signal to clamp said clock signal line when said clock clamp control signal indicates that said clock signal line needs to be clamped and said data stored in said peripheral controller means indicates said clock signal line can be clamped.

7. The system of claim 6 wherein said first logic gate means is a NAND gate, said second logic gate means is a NAND gate, and said third logic gate means is an AND gate.

8. A method for providing a system for clamping a clock signal line that prevents clock glitching comprising the steps of:

providing peripheral controller means for storing data indicating when said clock signal line can and cannot be clamped and for generating a clock clamp control signal for clamping said clock signal line;

providing first logic gate means coupled to said clock signal line and to said peripheral controller means for monitoring said clock clamp control signal;

providing second logic gate means coupled to said clock signal line and to said peripheral controller means for monitoring data stored in said peripheral controller means indicating when said clock signal line can and cannot be clamped; and providing third logic gate means coupled to an output of said first logic gate means and to an output of said second logic gate means for generating a signal to clamp said clock signal line when said clock clamp control signal indicates that said clock signal line needs to be clamped and said data stored in said peripheral controller means indicates said clock signal line can be clamped; and wherein said step of providing first logic gate means further comprises the step of providing a NAND gate.

9. The method of claim 8 wherein said step of providing peripheral controller means further comprises the steps of:

providing microprocessor means for generating said clock clamp control signal for clamping said clock signal line; and providing register means coupled to said microprocessor means and having a plurality of bits wherein at least one bit of said plurality of bits indicates a start condition when said clock signal line may begin to be clamped and a second bit of said plurality of bits indicates a stop condition when said clock signal line cannot be clamped.

10. The method of claim 8 further comprising the step of providing inverter means having an input coupled to said clock signal line and an output coupled to an input of said first logic gate means and to an input of said second logic gate means for sending an inverted clock signal to said first logic gate means and to said second logic gate means.

11. The method of claim 8 wherein said step of providing second logic gate means further comprises the step of providing a NAND gate.

12. The method of claim 8 wherein said step of providing third logic gate means further comprises the step of providing an AND gate.

* * * * *